April 17, 1962 S. I. WEISS Re. 25,161

FILAMENT BAR CASING AND METHOD OF MAKING SAME

Original Filed March 24, 1953

INVENTOR
Shirley Irving Weiss
BY
Dean Fairbank & Hirsch
ATTORNEYS

United States Patent Office

Re. 25,161
Reissued Apr. 17, 1962

25,161

FILAMENT BAR CASING AND METHOD OF MAKING SAME

Shirley I. Weiss, New York, N.Y., assignor to Trans-Sil Corporation, Englewood, N.J., a corporation of New Jersey Original No. 2,817,046, dated Dec. 17, 1957, Ser. No. 344,335, Mar. 24, 1953. Application for reissue Dec. 17, 1958, Ser. No. 781,174
5 Claims. (Cl. 317—234)

Figure 1:
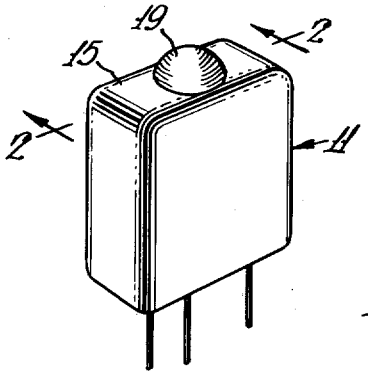

Matter enclosed in heavy brackets [ ] appears in the original patent but forms no part of this reissue specification; matter printed in italics indicates the additions made by reissue.

This invention relates to casings for filaments and more particularly to the casing for a filament bar of semi-conductive material and the method of making such casing.

As conducive to an understanding of the invention, it is noted that filaments of semi-conductive material such as germanium, when used, for example in electronic circuits in place of vacuum tubes, must have leads connected thereto for connection into the circuit. As the filaments are sensitive to temperatures above a certain critical value which cause disturbance of the molecular arrangement of the filament, with resultant malfunctioning, where the leads are connected to the filament by soldering a solder of relatively low melting point is generally used.

As the filament, which generally is in the shape of a bar, is small in size and brittle, it must be securely supported against vibration to prevent breakage, and as the operation of the filament will be impaired if it is subjected to dirt or dust, it is generally protected by a suitable casing.

Where the casing is porous and absorbs moisture after it is fabricated or if moisture is present in the casing, as the filament is extremely sensitive to such moisture, its effectiveness will be substantially impaired.

As the casing for the filament bar is extremely small, if heat above the critical temperature of the filament bar is applied for a considerable period of time to the casing while it is being fabricated, in addition to melting the soldered connections of the filament bar to the terminal leads, the bare is likely to be injured with resultant malfunctioning.

It is accordingly among the objects of the invention to provide a casing for a filament bar of semi-conductive material that is of substantially non-porous material and is small and compact, using inexpensive parts and which may readily be fabricated at low cost, which is substantially devoid of moisture in the interior in which the bar is positioned and in which the filament bar will be securely retained in position without likelihood of breakage due to vibration.

Another object is to provide a method of fabricating a filament bar casing of the above type which is relatively simple to perform, requiring substantially only conventional equipment and which ensures that no excessive temperature will be applied to the soldered connections of the filament bar to its terminal leads which might melt such solder or to the filament bar itself which would impair its functioning and which also ensures that the casing will be devoid of moisture which would also impair the functioning of the filament bar.

According to the invention, the filament bar casing desirably comprises a substantially cup-shaped housing of substantially non-porous material such as glass having a base of similar material bonded to the housing mouth to form a substantially integral unit. The filament bar of semi-conductive material is mounted in the housing which is evacuated of air and moisture, so that it will be securely supported, desirably on the base, without likelihood of vibration on the ends of terminal leads which extend through the base into the housing.

The casing is desirably fabricated by mounting the ends of the filament bar in holders formed at the inner ends of the terminal leads and affixing the ends of the bar in such holders, preferably by soldering with solder having a low melting point.

The rim of the base is positioned adjacent the rim of the housing with an intervening layer of powdered glass in which a metal ring is embedded. By means of induction heating the metal ring is rapidly heated to a temperature sufficient to melt the powdered glass and the adjacent surfaces of the housing and the base so that upon cooling, the base and the housing will be securely bonded together as substantially an integral unit.

The casing is thereupon evacuated by a suction pump applied to a stem integral with the housing and heat is then applied to the root end of the stem to melt the glass and such root end is squeezed together to cut off the stem and seal the casing.

Figure 2:
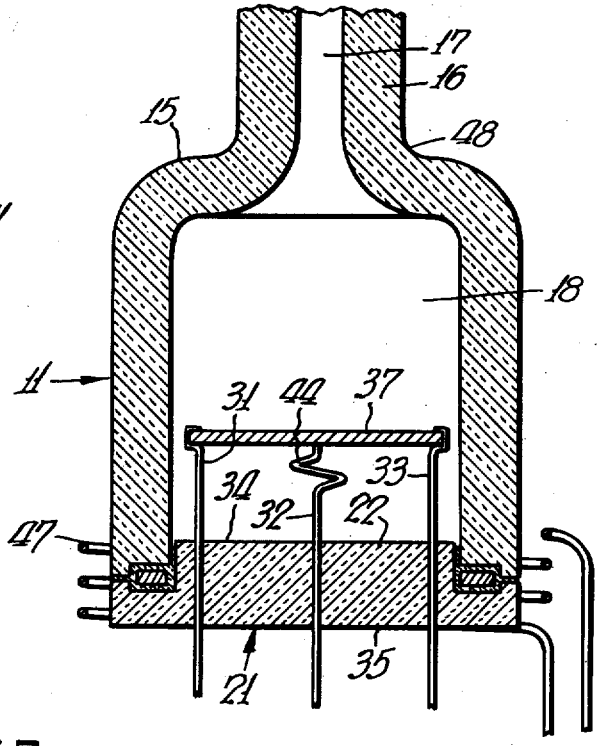
Figure 3:
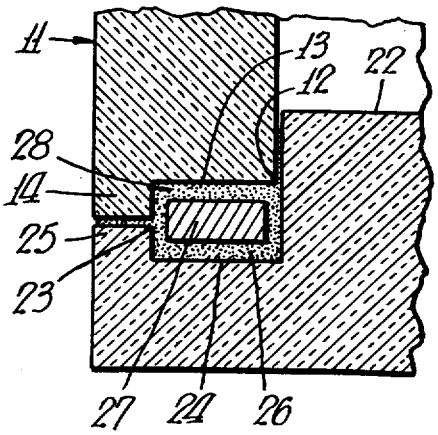
Figure 4:
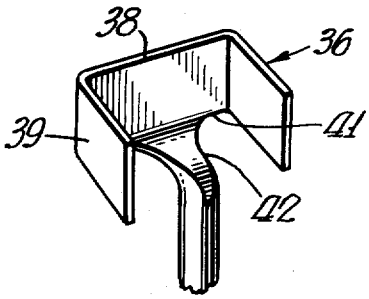

In the accompanying drawings in which are shown one or more of various possible embodiments of the several features of the invention, FIG. 1 is a perspective view of the casing, FIG. 2 is a sectional view on a larger scale taken along line 2—2 showing the casing in the process of being fabricated, FIG. 3 is a fragmentary sectional view similar to FIG. 2 showing the junction between the housing and the base, and FIG. 4 is a fragmentary perspective view on an enlarged scale showing a filament bar holder.

Referring now to the drawings, the filament bar casing desirably comprises a substantially rectangular cup-shaped housing 11 desirably of greater length than width and preferably formed of suitable insulating material such as soft glass.

The mouth 12 of the housing around its inner periphery is desirably cut away as at 13 to define a longitudinal peripheral flange 14 and the upper wall 15 of the housing before the casing is assembled has a hollow stem 16 formed integral therewith, the bore 17 of which leads into the cavity 18 of said housing.

After the casing is assembled and the stem 16 is cut off and the bore 17 sealed in the manner hereinafter described, a slight protuberance 19 may be present on the upper wall 15.

The casing has a base 21 also preferably of soft glass which also desirably is rectangular and of substantially the same outer dimensions as the housing. The base 21 has a rectangular central portion 22 rising above its rim 23 and of dimensions such that it may readily fit into the mouth 12 of the housing 11.

The rim 23 desirably has a groove 24 therein defining a longitudinal flange 25, said groove 24 and said flange 25 being aligned with the cut away portion 13 and flange 14 of housing 11 to define a cavity 26.

Positioned in such cavity is a metal ring 27 of "Dumet," as well as a charge of soft powdered glass 28 which when melted in the manner to be described, bonds the base 21 snugly to the housing 11 to form substantially an integral unit.

The base 21 desirably has molded therein a plurality of terminal leads illustratively three in number designated 31, 32 and 33, the leads 31 and 33 being near the ends of the base and the lead 32 being between such ends. As shown in FIG. 2, the leads 31, 32 and 33 protrude beyond both faces 34, 35 of the base 21 with the inner ends of leads 31 and 33 being conformed as holders 36 for a filament bar 37 which illustratively is of semi-conductive material such as germanium.

Although the holders 36 may be of any suitable type, as shown in FIG. 4, the upper end of each lead 31 and 33 is flattened to define a rear wall 38 and side walls 39.

The lower edge 41 of wall 38 is connected to the associated lead by the curved extension 42 thereof which forms the floor of the holder and extends substantially parallel to the inner surface 34 of the base 21.

As shown in FIG. 2, the rear walls of the holders 36 extend parallel to each other so that the ends of the filament bar 37 may be positioned therein to be securely retained in place as by soldering.

The terminal lead 32 desirably has a contact wire preferably a catswhisker 44 affixed as by welding to the inner end thereof and engaging selected region of the filament bar at a location that gives a desired output indicated as by means of an electric meter to which the terminal leads 31, 32, 33 are connected through suitable circuits. Although the contact wire 44 may be secured to the filament bar 37 in any suitable manner, it desirably is welded thereto.

To assemble the unit shown in FIG. 1, the filament bar 37 is positioned at its ends in the respective holders and securely retained in position as by soldering at a relatively low temperature of say 350° F. which is below the temperature at which the filament bar may be injured. The catswhisker is thereupon positioned against the bar 17 at the desired location for optimum output and welded thereto.

The groove 24 and flange 25 are then coated with a layer of powdered glass 28, the metal ring 27 is placed in the groove 24 and another layer of powdered glass is placed on the ring so that it is substantially embedded in such powdered glass. The housing 11 is then positioned on the base, as shown in FIG. 2, so that the flanges 14 and 25 are substantially abutting, being separated by a layer of powdered glass 28.

The unit thus far assembled is placed in an induction heating coil 47 so that the loops of the coil are aligned with the metal ring 27. The coil is then energized which will rapidly heat the ring 27 to melt the powdered glass 28 and the adjacent surfaces of the base 21 and housing 11. Desirably an inert cooling gas such as nitrogen is forced through the stem 16 into cavity 18 to cool the bar 37 to prevent injury thereto.

After a relatively short heating period, the power to the induction coil 47 is cut off and the molten glass will cool and solidify so that the base 21 and the housing 11 will be bonded together substantially as an integral unit.

At this time a conventional suction pump (not shown) is applied to the outer end of stem 16 to evacuate gas including air from the cavity 18. While this pumping action is going on, the root end 48 of stem 16 is softened as by an open flame directed thereagainst and the stem is pinched off in conventional manner to seal the bore 17, resulting in the slight protuberance 19.

With the method above described, the unit may readily be fabricated without likelihood of injury to the bar 37 or melting of the soldered connection thereof to the holders 36 by the application of excessive heat thereto.

As the cavity 18 will be substantially completely evacuated of air and as the casing is substantially nonporous, no moisture will form in the unit which might cause improper operation.

As many changes could be made in the above method and construction, and many apparently widely different embodiments of this invention could be made without departing from the scope of the claims, it is intended that all matter contained in the above description or shown in the accompanying drawings shall be interpreted as illustrative and not in a limiting sense.

Having thus described my invention, what I claim as new and desire to secure by Letters Patent of the United States is:

1. A casing for a filament bar of semi-conductive material comprising a cup-shaped glass housing having a mouth, a glass base member extending over said mouth, the adjacent surfaces of said casing and said base being conformed to define a cavity therebetween, a metal member in said cavity extending completely therearound and solidified powdered glass in said cavity in which said metal member is embedded, said solidified glass forming an uninterrupted layer between the adjacent surfaces of the housing and the base and bonding said surfaces integrally together, a pair of spaced holders in said housing and a bar of semi-conductive material positioned at its ends on said holders.

2. The combination recited in claim 1 in which a pair of terminal leads are fixed in said base and extend inwardly into the housing, said holders being at the inner ends of said leads.

3. The combination recited in claim 2 in which each of said holders has a floor, a back wall and two side walls integral with the associated terminal leads.

4. A casing for a filament bar of semi-conductive material comprising a cup-shaped housing of glass having a mouth at one end, the inner periphery of said mouth being cut away to form a longitudinal flange, a glass base extending across the mouth of said housing, said base having a central portion extending into said mouth and defining a peripheral rim, a peripheral groove in said rim aligned with said cut away portion and forming a longitudinal flange aligned with the flange of said housing, said groove and said cut away portion defining a cavity, a metal member in said cavity encompassing said central portion, a solidified layer of powdered glass in said cavity in which said metal member is embedded, said solidified powdered glass forming an uninterrupted layer between the adjacent surface of said base and said housing and bonding said surfaces integrally together, a pair of terminal leads affixed in said base and extending inwardly into said housing and a filament bar affixed at its ends to the respective inner ends of said leads.

*5. An envelope having an opening, the inner peripheral portion of said envelope at said opening being cut away to form a circumferential flange at the end of said envelope, a glass closure extending across the opening of said envelope, said closure having a central portion extending into said opening and having an edge surface adjacent the inner surface of the envelope, said central closure portion defining a peripheral rim on said closure, a peripheral groove in said closure rim aligned with said cutaway portion of said envelope and forming a circumferential flange aligned with the flange of said envelope, said groove and said cut away envelope portion defining a cavity, metallic means in said cavity encompassing said central portion, a body of glass in said cavity with said metallic means embedded therein, said body of glass also extending between adjacent surfaces of said envelope and closure, said body of glass having been solidified from a powder rendered molten by heating said metallic means, said solidified glass forming an uninterrupted layer between the adjacent surfaces of said circumferential flanges of said closure and said envelope and between the adjacent surfaces of the central portion of said closure and the envelope, said layers of glass bonding said surfaces integrally together.*

References Cited in the file of this patent or the original patent

UNITED STATES PATENTS

| | | |
|---|---|---|
| 1,723,579 | Ruben | Aug. 6, 1929 |
| 2,297,492 | Michaelis | Sept. 29, 1942 |
| 2,468,051 | Escoffery | Apr. 26, 1949 |
| 2,568,460 | Nolte | Sept. 18, 1951 |
| 2,595,475 | McLaughlin | May 6, 1952 |
| 2,629,093 | Pask et al. | Feb. 17, 1953 |
| 2,633,489 | Kinman | Mar. 31, 1953 |
| 2,664,528 | Stelmak | Dec. 29, 1953 |

FOREIGN PATENTS

| | | |
|---|---|---|
| 22,911A | Great Britain | 1906 |
| 108,056 | Australia | July 21, 1937 |
| 139,678 | Australia | Dec. 11, 1950 |